US008295514B2

United States Patent
Song

(10) Patent No.: US 8,295,514 B2
(45) Date of Patent: Oct. 23, 2012

(54) MEMS MICROPHONE PACKAGE HAVING SOUND HOLE IN PCB

(75) Inventor: Chung Dam Song, Seoul (KR)

(73) Assignee: BSE Co., Ltd., Incheon (KR)

( * ) Notice: Subject to any disclaimer, the term of this patent is extended or adjusted under 35 U.S.C. 154(b) by 938 days.

(21) Appl. No.: 12/249,343

(22) Filed: Oct. 10, 2008

(65) Prior Publication Data

US 2009/0116669 A1 May 7, 2009

(30) Foreign Application Priority Data

Nov. 2, 2007 (KR) .................. 10-2007-0111429

(51) Int. Cl.
*H04R 25/00* (2006.01)
*H04R 9/08* (2006.01)

(52) U.S. Cl. ........................ 381/174; 381/369

(58) Field of Classification Search ................. 381/174, 381/369

See application file for complete search history.

(56) References Cited

U.S. PATENT DOCUMENTS

| 6,781,231 | B2 | 8/2004 | Minervini | |
|---|---|---|---|---|
| 7,907,743 | B2* | 3/2011 | Izuchi et al. | 381/174 |
| 2006/0157841 | A1* | 7/2006 | Minervini | 257/680 |
| 2007/0205492 | A1* | 9/2007 | Wang | 257/659 |
| 2008/0112585 | A1* | 5/2008 | Izuchi et al. | 381/361 |
| 2009/0034773 | A1* | 2/2009 | Song | 381/369 |

* cited by examiner

*Primary Examiner* — Lex Malsawma
(74) *Attorney, Agent, or Firm* — Ladas & Parry LLP

(57) ABSTRACT

Provided is a MEMS microphone package having a sound hole in a PCB, which can ground-connect a metal case to a main board using an assembly process including bending and clamping an end of the case. The MEMS microphone package includes a tetragonal container-shaped metal case having an open-side to insert components into an inner space, and a chamfered end on the open-side to easily perform a curling operation, a printed circuit board (PCB) substrate to which a MEMS microphone chip and an application specific integrated circuit (ASIC) chip are mounted, the PCB substrate being inserted into the metal case and having a sound hole for introducing an external sound, and a support configured to support the PCB substrate in the curling operation and define a space between the metal case and the PCB substrate.

14 Claims, 3 Drawing Sheets

MEMS MICROPHONE PACKAGE HAVING SOUND HOLE IN PCB

BACKGROUND OF THE INVENTION

1. Field of the Invention

The present invention relates to a micro electro mechanical systems (MEMS) microphone package, and more particularly, to a MEMS microphone package that can ground-connect a metal case to a main board using an assembly process including bending and clamping an end of the case and providing a sound hole to a printed circuit board (PCB) to vary a mounting method.

2. Description of the Related Art

Generally, a condenser microphone includes a diaphragm and a back plate. The diaphragm has a flexible membrane attached to a side electrode and is vibrated by an acoustic pressure. The back plate is spaced apart from the diaphragm through a spacer and the two face each other. The diaphragm and the back plate form the parallel electrode plates of a condenser and provide electric charges between the two electrode plates by applying a DC voltage to the two electrode plates or forming an electret at one of the two electrode plates. Such a general condenser microphone is assembled in a curling manner where a diaphragm, a spacer, a base 1, a back plate, a base 2, and a PCB to which an electric circuit is mounted are sequentially stacked on a cylindrical case and then an end of the case is bent and clamped toward the PCB.

In a completed condenser microphone assembly, a distance between the diaphragm and the back plate is changed by an external acoustic pressure, which then changes the capacitance of the condenser. This change of the capacitance is processed by an electric circuit so that electrical signals are provided according to the change of the acoustic pressure.

A condenser microphone used in communication products includes an electret that is formed on a back plate with a high molecular membrane. Such condenser microphones are economical, but there is a limit to miniaturization. Thus, for extreme miniaturization of a microphone, an electrical capacity structure is realized on a silicon wafer in a die shape using a semiconductor-manufacturing technology and a micromachining technology. This electrical capacity structure is referred to as a silicon condenser microphone chip or a MEMS microphone chip. Such MEMS microphone chips must be packaged for protection against exterior interference.

A system for packaging a MEMS microphone chip is disclosed in U.S. Pat. No. 6,781,231, entitled "MICROELECTROMECHANICAL SYSTEM PACKAGE WITH ENVIRONMENTAL AND INTERFERENCE SHIELD", issued on Aug. 24, 2004. Referring to FIG. 1, such a MEMS microphone package is achieved in a manner where a housing is formed by attaching a case 34, including a conductive layer or a conductor, to a PCB substrate 32 through a conductive adhesive 36. A MEMS microphone chip 10 and an application specific integrated circuit (ASIC) 20 are mounted to the PCB substrate 32. The ASIC 20 is configured to electrically drive the MEMS microphone chip 10 and process signals. The case 34 including a sound hole 34*a* is attached to the PCB substrate 32 through the adhesive 36 to protect the MEMS microphone chip 10 therein.

SUMMARY OF THE INVENTION

Accordingly, the present invention is directed to a MEMS microphone package having a sound hole in a PCB that solves one or more of the problems that arise due to the limitations and disadvantages of the related art.

In packaging a MEMS microphone chip and manufacturing a MEMS microphone package according to a related art, in the case of a method of attaching a case to a PCB substrate with an adhesive or welding, external noise is introduced into a PCB in the form of a dielectric between the case and the main board when the microphone package is mounted to a main board. This reduces the shielding effect for blocking external noise. Particularly, in the case of cellular phones having a built-in antenna, which is widely used in these days, since the antenna is very close to a microphone due to the mechanical conditions thereof, a RF noise of the antenna is easily introduced into the microphone. Thus, shielding of the microphone against the RF noise is more important. However, there is a limitation for related art HEMS microphone packages in meeting this requirement.

Also, a MEMS microphone packaging method, including attaching a case to a PCB substrate with an adhesive or welding, is different from a cheap curling operation where a metal case is bent and components are fixed in the metal case to assemble a microphone. Thus, new mechanical equipment is required for the attaching or the welding, thereby increasing building cost for a new manufacturing line.

An object of the present invention is to provide a HEMS microphone package having a sound hole in a PCB, which can improve noise-blocking characteristics and reduce manufacturing costs without an additional manufacturing facility, by directly mounting a metal case of the MEMS microphone package to a main board using a curling process whereby an end of the metal case is bent and clamped in a condenser microphone-assembling process.

Additional advantages, objects, and features of the invention will be set forth in part in the description which follows and in part will become apparent to those having ordinary skill in the art upon examination of the following, or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a MEMS microphone package including: a tetragonal container-shaped metal case having an open-side to insert components into an inner space, and having a chamfered end on the open-side to easily perform a curling operation; a PCB substrate to which a MEMS microphone chip and an ASIC chip are mounted, the PCB substrate being inserted into the metal case and having a sound hole for introducing an external sound; and a support configured to support the PCB substrate in the curling operation and to define a space between the metal case and the PCB substrate.

The MEMS microphone chip and the ASIC chip may be mounted to a surface of the PCB substrate, and a conductive pattern for connection to the metal case may be provided to a boundary of another surface, and connection terminals, including a power (Vdd) terminal, an output terminal, and a ground (GND) terminal, may be provided to a center of the surface having the boundary.

The MEMS microphone chip may include a back plate disposed on a silicon wafer using a MEMS technology; and then a diaphragm with a spacer disposed between the diaphragm and the back plate. The ASIC chip may include: a voltage pump providing a bias voltage such that the MEMS microphone chip serves as a condenser microphone; and a buffer amplifier amplifying or impedance-matching an electrical sound signal detected through the MEMS microphone chip to provide the signals through the connection terminals to an outside.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in, and constitute, a part of this application, illustrate embodiments of the invention and, together with the description, serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
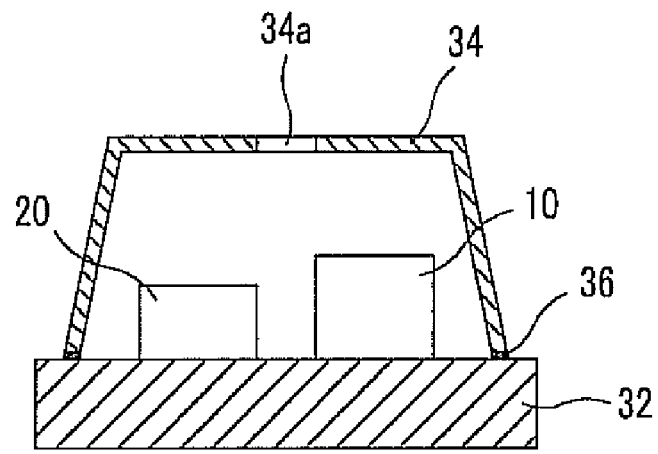
FIG. 1 is a cross-sectional view illustrating a related art MEMS microphone package.
Figure 2:
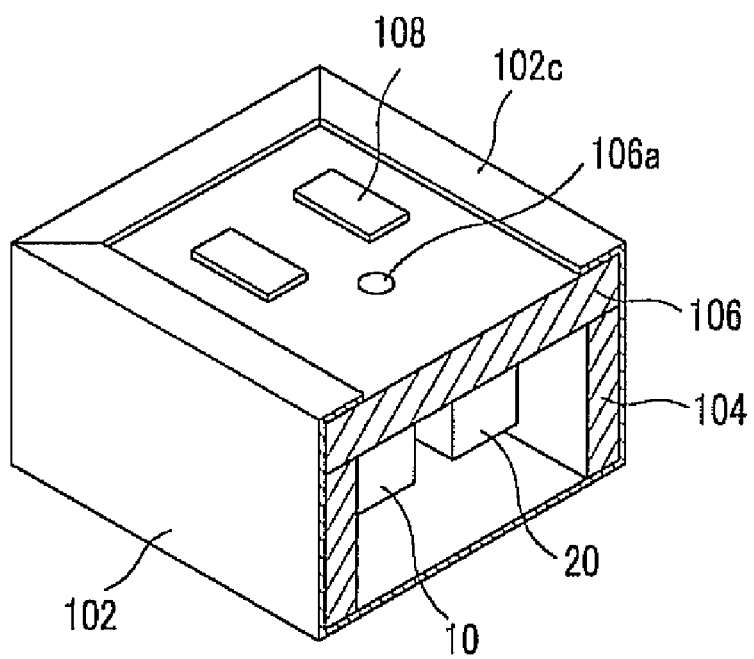
FIG. 2 is a cut-away perspective view illustrating a MEMS microphone package having a sound hole in a PCB according to an embodiment of the present invention.
Figure 3:
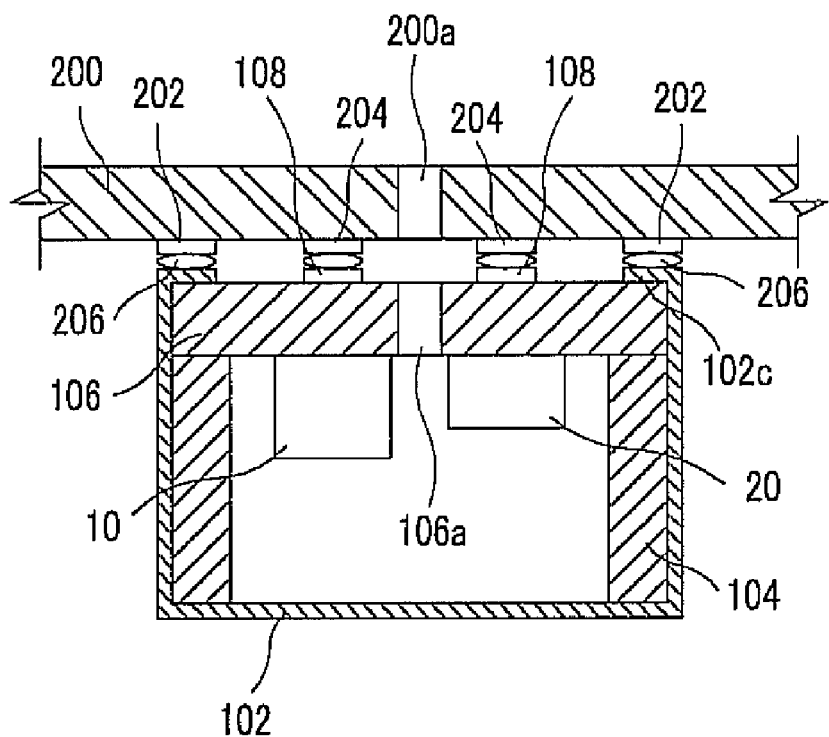
FIG. 3 is a cross-sectional view illustrating a MEMS microphone package having a sound hole in a PCB according to an embodiment of the present invention.
Figure 4:
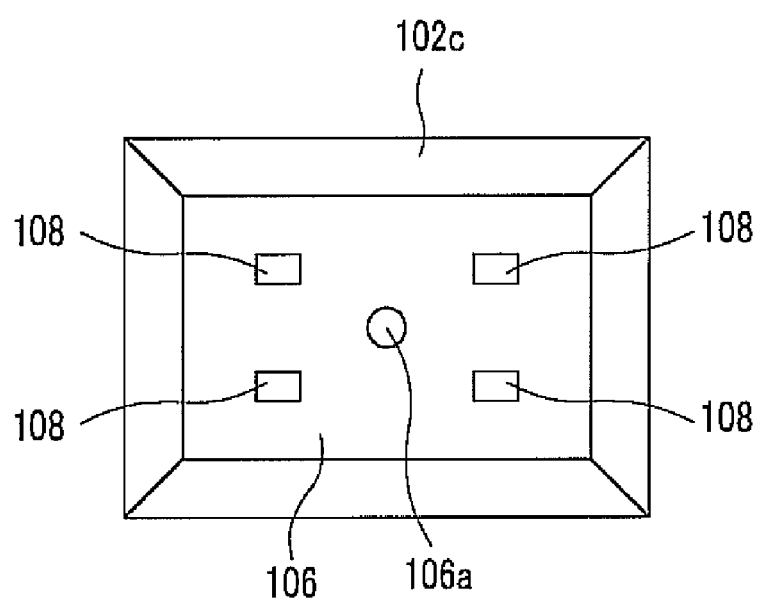
FIG. 4 is a bottom view illustrating a MEMS microphone package having a sound hole in a PCB according to an embodiment of the present invention.

FIG. 2 is a cut-away perspective view illustrating a MEMS microphone package 100 having a sound hole 106a in a PCB according to an embodiment of the present invention. FIG. 3 is a cross-sectional view illustrating the MEMS microphone package 100 having the sound hole 106a in the PCB according to an embodiment of the present invention. FIG. 4 is a bottom view illustrating the MEMS microphone package 100 having the sound hole 106a in the PCB according to the embodiment of the present invention.

Referring to FIGS. 2 through 4, a tetragonal condenser microphone according to the present invention includes a tetragonal container-shaped case 102, a PCB substrate 106, and a support 104. The tetragonal container-shaped case 102 has an open-side for receiving parts and open-side ends 102c having chamfered edges for easy curling. The PCB substrate 106 includes the sound hole 106a and is inserted into the case 102, and a MEMS microphone chip 10 and an ASIC chip 20 are mounted to the PCB substrate 106. The support 104 supports the PCB substrate 106 to define a space between the case 102 and the PCB substrate 106.

Figure 5:
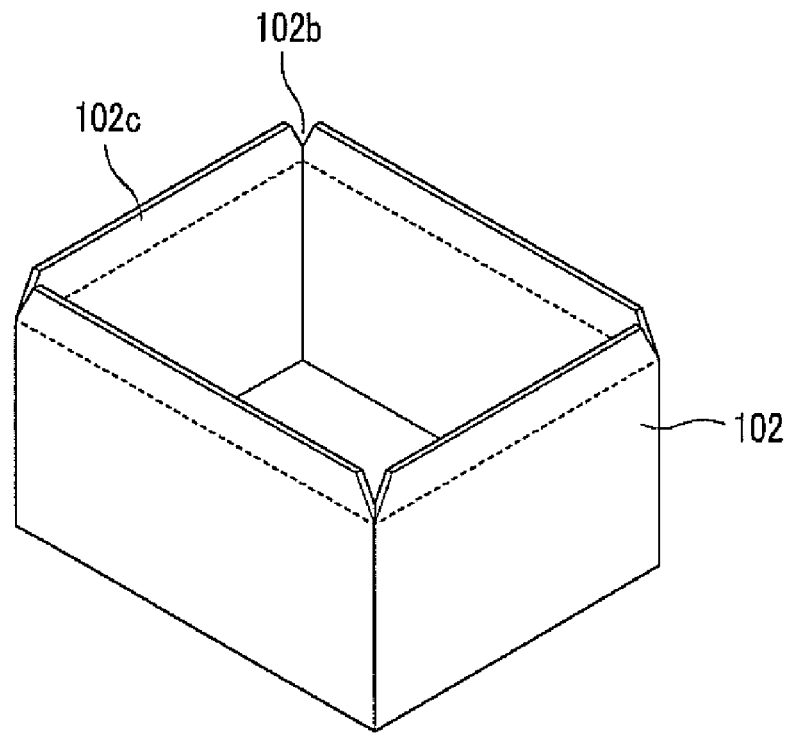
FIG. 5 is a perspective view illustrating a case used in a MEMS microphone package having a sound hole in a PCB according to an embodiment of the present invention.

Referring to FIG. 5, the metal case 102, used in the microphone package 100 according to the present invention, has a tetragonal shape with the open side. The case 102 includes the four edges 102b of the open side and a sound hole 102a. The four edges 102b are chamfered to prevent the respective ends 102c from overlapping the adjacent ends 102c when curling.

Figure 6:
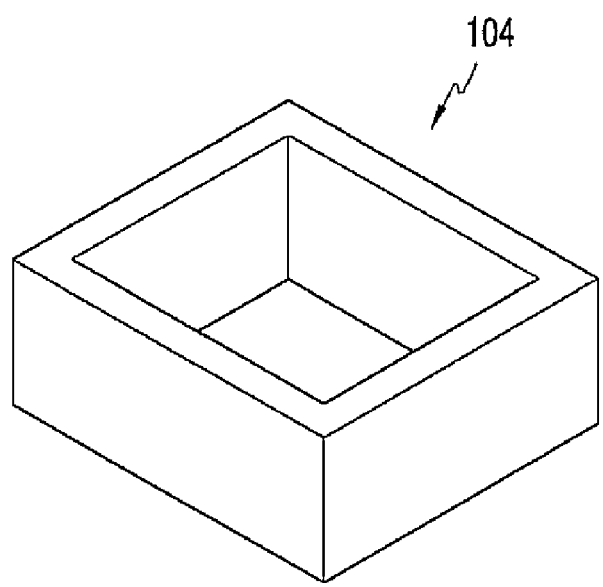
FIG. 6 is a perspective view illustrating a support used in a MEMS microphone package having a sound hole in a PCB according to an embodiment of the present invention.

Referring to FIG. 6, the support 104 has a tetragonal ring shape and is disposed between a bottom of the case 102 and the PCB substrate 106. The support defines an inner space and supports the PCB substrate 106 when curling the ends 102c. That is, the microphone package 100 according to the present invention is configured to prevent the respective ends 102c from overlapping the adjacent ends 102c when curling, thereby providing an easy curling operation and preventing deformation of the case 102 due to the support 104 during the curling.

The PCB substrate 106 includes the sound hole 106a for introducing an external sound, in a center thereof. The MEMS microphone chip 10 and the ASIC chip 20 are mounted to a surface of the PCB substrate 106. A conductive pattern for connection to the case 102 is provided to a boundary of another surface, and connection terminals 108, including a power (Vdd) terminal, an output terminal and a ground (GND) terminal, are provided to a center of the surface for the conductive pattern. Although four connection terminals 108 are exemplified in this embodiment, the number of the connection terminals 108 may be 2 or more according to application. The MEMS microphone chip 10 includes a back plate and a diaphragm. The back plate is formed on a silicon wafer using a MEMS technology, and then a spacer is formed between the diaphragm and the back plate. The ASIC chip 20 is connected to the MEMS microphone chip 10 to process electrical signals. The ASIC chip 20 includes a voltage pump and a buffer amplifier. The voltage pump provides a bias voltage such that the MEMS microphone chip 10 serves as a condenser microphone. The buffer amplifier amplifies or impedance-matches electrical sound signals detected through the MEMS microphone chip 10 to provide the signals through the connection terminals 108 to the outside. The protruding connection terminals 108 are adapted for surface mounting to a main substrate 200.

The tetragonal ring-shaped support 104 is inserted into the tetragonal container-shaped metal case 102 having the open-side, then the PCB substrate 106 having the surface-mounted MEMS microphone chip 10 and ASIC chip 20 is inserted and disposed on the support 104, and then the ends 102c are bent toward the PCB substrate 106 through the curling to closely contact the conductive pattern, so that the MEMS microphone package 100 is completed.

In the completed MEMS microphone package 100 made according to this manner as illustrated in FIGS. 2 through 4, the support 104 is inserted in the case 102 and supports the PCB substrate 106 to which circuit components are surface-mounted. The support 104 defines the inner space, and the ends 102c are in close contact with the PCB substrate 106 through the curling.

As illustrated in FIG. 3, the MEMS microphone package 100 is mounted to the main substrate 200, which has a sound hole 200a for introducing an external sound, through a surface mounting technology (SMT) or a soldering method. Thus, the MEMS microphone package 100 is connected to pads 204 of the main substrate 200 corresponding to the connection terminals 108 of the PCB substrate 106, and the ends 102c are connected to ground patterns 202 of the main substrate 200. This electrically shields the entire microphone as a Faraday cup that prevents the outside noise from being introduced into the microphone. Thus, in the case where the HEMS microphone package 100 is applied to a cellular phone, even when an antenna and the microphone are adjacent to each other, an RF noise of the antenna is prevented from being introduced into the microphone. This maintains the good sound quality characteristics of a product.

Referring to FIG. 3, power is supplied through the power terminal and the ground terminal from the main substrate 200 to the MEMS microphone package 100, which is mounted to the main substrate 200. An appropriate bias voltage generated by the voltage pump of the ASIC chip 20 is applied to the HEMS microphone chip 10 to generate electric charges between the back plate and the diaphragm of the MEMS microphone chip 10.

When an exterior acoustic pressure is introduced into the inner space through the sound hole 200a and the sound hole 106a, the diaphragm of the HEMS microphone chip 10 vibrates and the capacitance between the diaphragm and the back plate changes. The change of the capacitance is amplified as electrical signals in the buffer amplifier of the ASIC chip 20 and output to the main substrate 200 through the output terminal.

The HEMS microphone package according to the present invention, manufactured through the curling process where the end of the metal case is chamfered and clamped, shields the MEMS microphone chip therein against external noise to greatly improve the sound quality. The MEMS microphone package accomplishes this by directly connecting the bent ends of the case to the main board to form a Faraday cup when mounting the microphone package to the main board.

Particularly, when the MEMS microphone package having the sound hole in the PCB of the present invention is applied to communication fields, the noise-blocking performance is improved by preventing the RF noise of the antenna from being introduced into the antenna, even when the antenna and the microphone are adjacent to each other, thereby maintaining excellent sound quality.

Also, according to the present invention, when the MEMS microphone chip is packaged, manufacturing costs are reduced without an additional manufacturing facility, and when the curling operation is performed, the ends of the tetragonal container-shaped case are prevented from overlapping the adjacent ends, so that the curling operation is easily performed and deformation of the case due to the support in the curling operation is prevented.

Also, according to the present invention, since the sound hole is disposed in the PCB substrate, after the sound hole is formed in the main board, the mounting to an inner surface thereof is allowed, thereby varying the mounting method according to a mechanical condition of a product to which the main board is mounted.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A micro electro mechanical systems (MEMS) microphone package comprising:
    a tetragonal container-shaped metal case having an open-side to insert components into an inner space, and a chamfered end on the open-side to facilitate performing a curling operation;
    a printed circuit board (PCB) substrate to which a MEMS microphone chip and an application specific integrated circuit (ASIC) chip are mounted, the PCB substrate being inserted into the metal case and having a sound hole for introducing an external sound, wherein the chamfered end of the tetragonal container-shaped metal case is clamped down on the PCB substrate; and
    a support configured to support the PCB substrate in the curling operation and define a space between the metal case and the PCB substrate.

2. The MEMS microphone package of claim 1, wherein the MEMS microphone chip and the ASIC chip are mounted to a surface of the PCB substrate, and a conductive pattern for connection to the metal case is provided to a boundary of another surface and connection terminals, including a power (Vdd) terminal, an output terminal, and a ground (GND) terminal, are provided to the center of the surface having the boundary.

3. The MEMS microphone package of claim 1, wherein the MEMS microphone chip comprises:
    a back plate disposed on a silicon wafer using a MEMS technology; and
    a diaphragm with a spacer disposed between the diaphragm and the back plate, and
    the ASIC chip comprises:
    a voltage pump providing a bias voltage such that the MEMS microphone chip serves as a condenser microphone; and
    a buffer amplifier amplifying or impedance-matching an electrical sound signal detected through the MEMS microphone chip to provide the signals through the connection terminals to the outside.

4. The MEMS microphone package of claim 1, wherein the support has a tetragonal ring shape.

5. The MEMS microphone package of claim 1, wherein the PCB substrate comprises a conductive pattern for connection to the tetragonal container-shaped metal case, and the chamfered end on the open side is bent towards the PCB substrate to contact the conductive pattern.

6. The MEMS microphone package of claim 1, wherein support extends from a side of the tetragonal container-shaped metal case that is opposite the open-side to the PCB substrate in order to support the PCB substrate in the curling operation and define the space between the metal case and the PCB substrate.

7. A micro electro mechanical systems (MEMS) microphone package comprising:
    a tetragonal container-shaped metal case having an open-side to insert components into an inner space, and a chamfered end on the open-side bent and clamped toward the PCB;
    a printed circuit board (PCB) substrate to which a MEMS microphone chip and an application specific integrated circuit (ASIC) chip are mounted, the PCB substrate being inserted into the metal case and having a sound hole penetrating the PCB substrate and in communication with the open-side such that an external sound is introduced through the open-side and sound hole; and
    a support configured to support the PCB substrate in a curling operation and define a space between the metal case and the PCB substrate,
    the PCB substrate being interposed between the support and the chamfered end and being supported by both the chamfered end and the support to be fixed in place upon the curling operation.

8. The MEMS microphone package of claim 7, wherein the support has a tetragonal ring shape.

9. The MEMS microphone package of claim 7, wherein the PCB substrate comprises a conductive pattern for connection to the tetragonal container-shaped metal case, and the chamfered end on the open side is bent towards the PCB substrate to contact the conductive pattern.

10. The MEMS microphone package of claim 7, wherein support extends from a side of the tetragonal container-shaped metal case that is opposite the open-side to the PCB substrate in order to support the PCB substrate in the curling operation and define the space between the metal case and the PCB substrate.

11. A micro electro mechanical systems (MEMS) microphone package connected to a main board comprising:
   a tetragonal container-shaped metal case having an open-side to insert components into an inner space, and a chamfered end on the open-side to facilitate performing a curling operation;
   a printed circuit board (PCB) substrate to which a MEMS microphone chip and an application specific integrated circuit (ASIC) chip are mounted, the PCB substrate being inserted into the metal case and having a sound hole for introducing an external sound;
   a support configured to support the PCB substrate in the curling operation and define a space between the metal case and the PCB substrate; and
   the main board to which the MEMS microphone package is connected, wherein the chamfered end of the tetragonal container-shaped metal case is directly connected to the main board to form a Faraday cup.

12. The MEMS microphone package connected to a main board of claim 11, wherein the MEMS microphone chip and the ASIC chip are mounted to a surface of the PCB substrate, and a conductive pattern for connection to the metal case is provided to a boundary of another surface and connection terminals, including a power (Vdd) terminal, an output terminal, and a ground (GND) terminal, are provided to the center of the surface having the boundary.

13. The MEMS microphone package connected to a main board of claim 11, wherein the MEMS microphone chip comprises:
   a back plate disposed on a silicon wafer using a MEMS technology; and
   a diaphragm with a spacer disposed between the diaphragm and the back plate, and
   the ASIC chip comprises:
   a voltage pump providing a bias voltage such that the MEMS microphone chip serves as a condenser microphone; and
   a buffer amplifier amplifying or impedance-matching an electrical sound signal detected through the MEMS microphone chip to provide the signals through the connection terminals to the outside.

14. The MEMS microphone package of claim 11 connected to a main board, wherein support extends from a side of the tetragonal container-shaped metal case that is opposite the open-side to the PCB substrate in order to support the PCB substrate in the curling operation and define the space between the metal case and the PCB substrate.

* * * * *